United States Patent [19]

Leue et al.

[11] Patent Number: 4,680,547

[45] Date of Patent: Jul. 14, 1987

[54] GRADIENT FIELD SWITCH FOR IMPROVED MAGNETIC RESONANCE IMAGING/SPECTROSCOPY SYSTEM

[75] Inventors: William M. Leue, Albany; Raymond J. Hodsoll, Jr., Galway, both of N.Y.; Gary H. Glover, Oconomowoc, Wis.; John T. Adamchick, Amsterdam, N.Y.

[73] Assignee: General Electric Company, Schenectady, N.Y.

[21] Appl. No.: 743,115

[22] Filed: Jun. 10, 1985

[51] Int. Cl.⁴ .......................................... G01R 33/20
[52] U.S. Cl. .................................................. 324/309
[58] Field of Search ............... 324/309, 313, 318, 322; 128/653; 73/626

[56] References Cited

U.S. PATENT DOCUMENTS

| | | | |
|---|---|---|---|
| 4,372,323 | 2/1983 | Takemura et al. | 128/660 |
| 4,510,448 | 4/1985 | Riedl | 324/309 |

Primary Examiner—Michael J. Tokar
Attorney, Agent, or Firm—Geoffrey H. Krauss; James C. Davis, Jr.; Marvin Snyder

[57] ABSTRACT

A gradient field switch, for use in an improved nuclear magnetic resonance imaging and spectroscopy system, includes a control portion and a switching portion. The switching portion receives a plurality of magnetic field gradient signals and connects each signal to an associated one of at least the same plurality of outputs. The exact pattern of input-output interconnections is established by the control portion responsive to data received after the presence of a reset signal. By appropriate control data input, the gradient field signals can be routed to axes of a predetermined coordinate system, such that images of a sample can be obtained from several directions, responsive to command signals and without requiring physical movement of the sample being imaged.

13 Claims, 12 Drawing Figures

ASSEMBLE FIG.S
2a THRU 2d
AS SHOWN

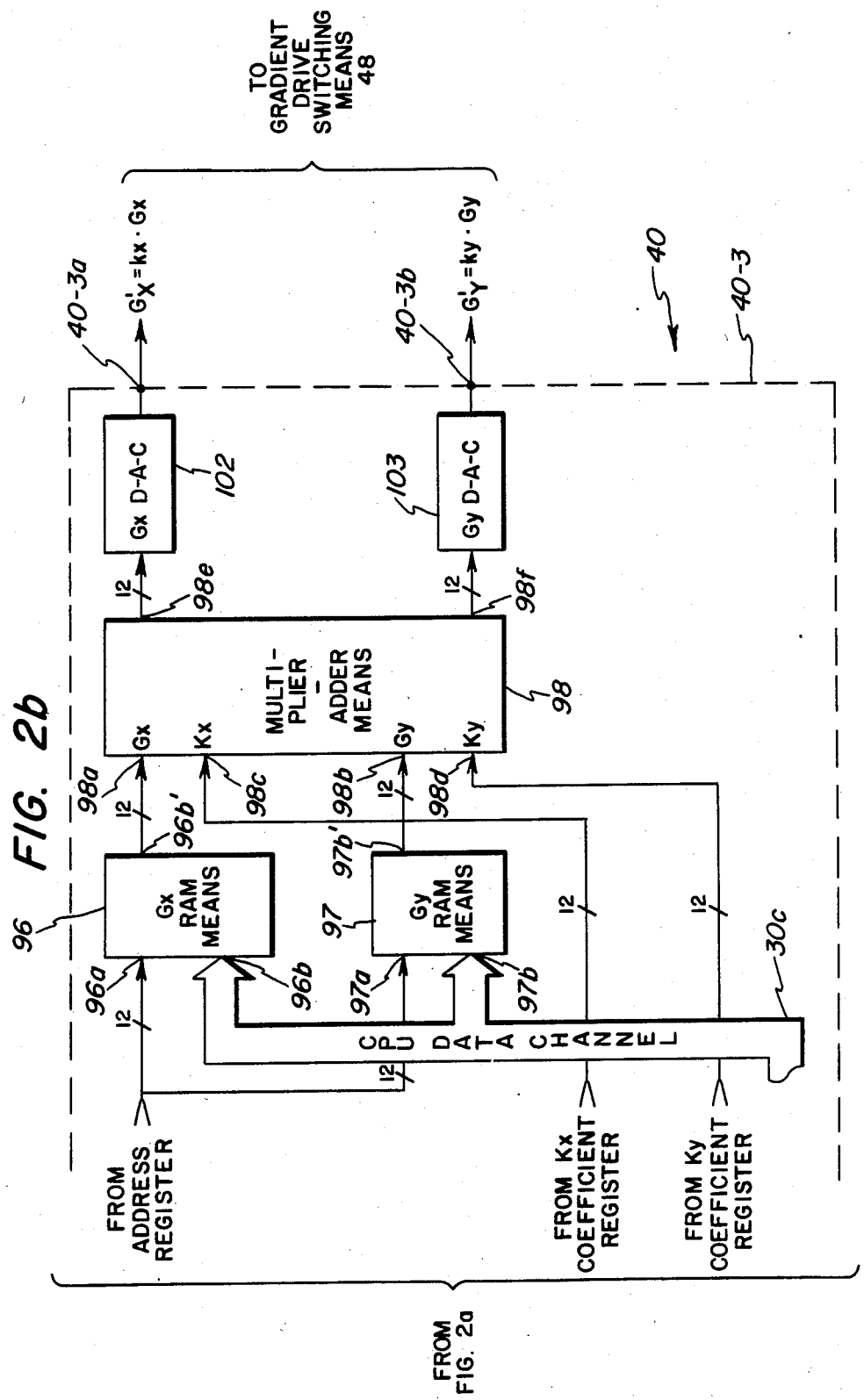

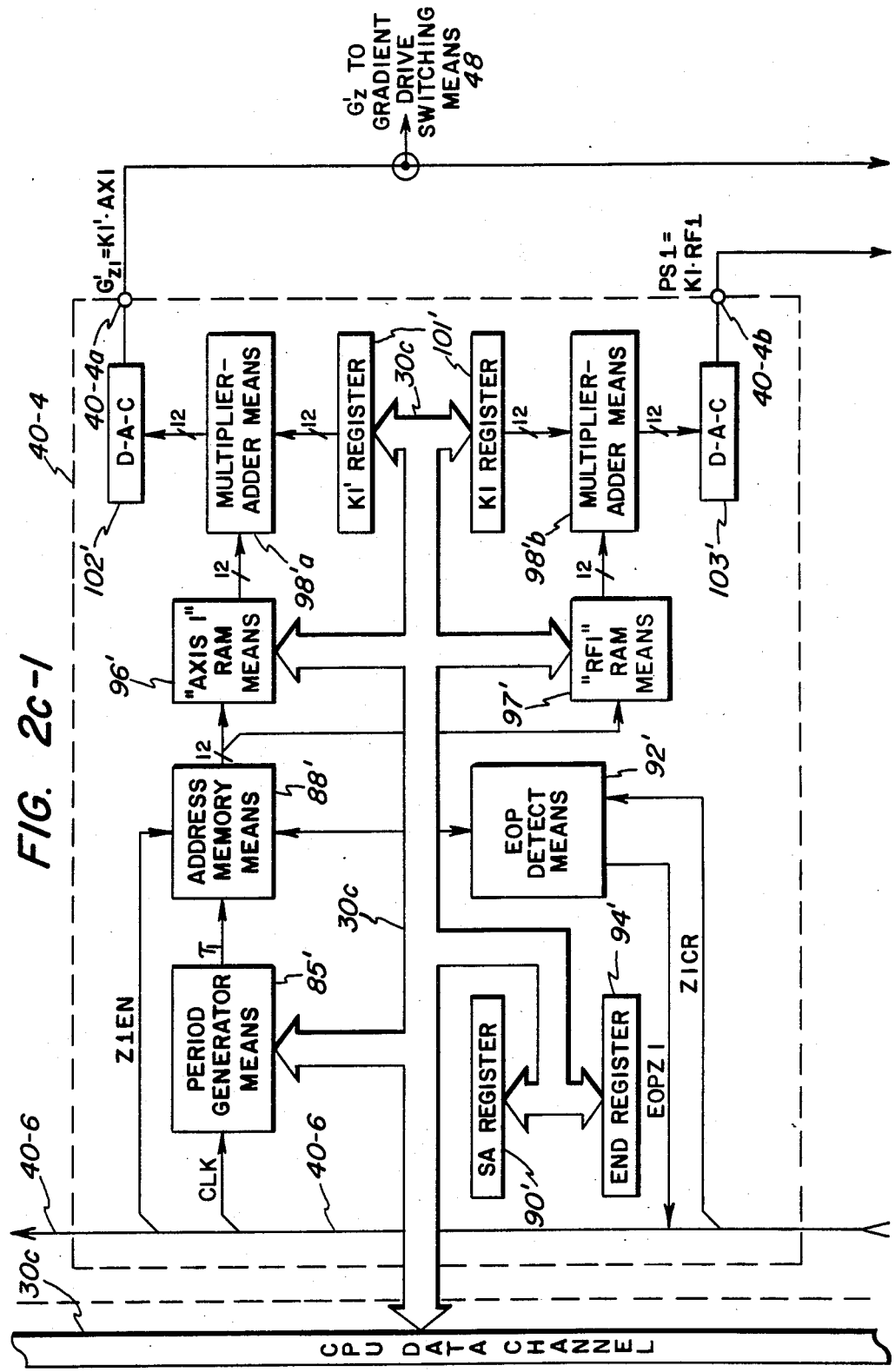

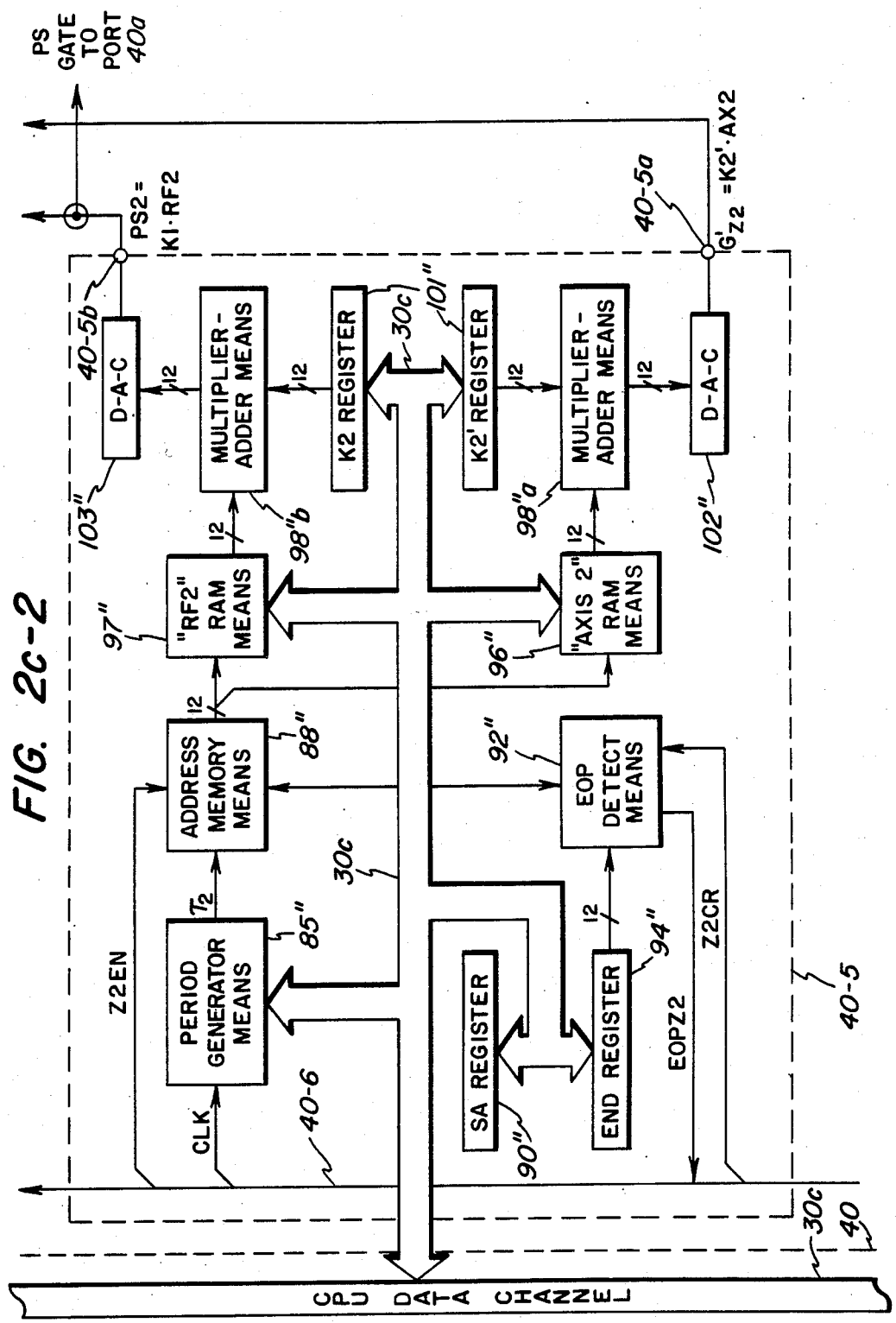

MICRO CODE DATA WORD FORMAT

FIG. 3a

| #GS LONG | SHORT | $G'_X$ | $G'_Y$ | $G'_Z$ | EFFECT ON $G_{out}$ | IMAGE-SLICE DIRECTION e.g. |
|---|---|---|---|---|---|---|
| 0 | 0 | | | | NONE | AS PREVIOUSLY COMMANDED |
| 1 | 1 | $G_X$ | $G_Y$ | $G_Z$ | RESET TO "NORMAL" | AXIAL-NORMAL: Y↑→X |
| 1 | 2 | $G_Z$ | $G_X$ | $G_Y$ | ROTATE "RIGHT" | SAGITTAL-NORMAL: Y↑→Z |
| 1 | 3 | $G_Y$ | $G_Z$ | $G_X$ | ROTATE "LEFT" | CORONAL-NORMAL: Z↑→X |
| 1 | 4 | $G_Z$ | $G_Y$ | $G_X$ | SWAP X & Z | SAGITTAL-ROTATED: Z↑→Y |
| 1 | 5 | $G_X$ | $G_Z$ | $G_Y$ | SWAP Y & Z | CORONAL-ROTATED: X↑→Z |
| 1 | 6 | $G_Y$ | $G_X$ | $G_Z$ | SWAP X & Y | AXIAL-ROTATED: X↑→Y |

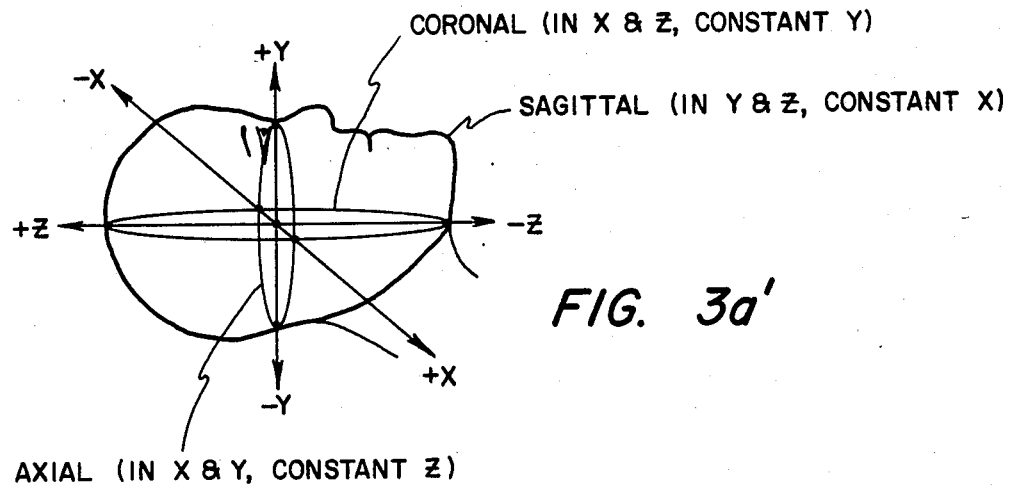

FIG. 3a'

GRADIENT FIELD SWITCH FOR IMPROVED MAGNETIC RESONANCE IMAGING/SPECTROSCOPY SYSTEM

RELATED APPLICATIONS

This application is related to applications Ser. Nos. 743,125, 743,119, and 743,121, filed on even date herewith, all assigned to the assignee of the present application and incorporated herein by reference in their entireties. Particularly relevant sections of all three applications are those concerned with FIG. 2 thereof, and also concerned with FIG. 3 of Ser. No. 743,125.

BACKGROUND OF THE INVENTION

The present invention is directed to nuclear magnetic resonance imaging and spectroscopy systems and, more particularly, to a novel gradient field switch for use in an imaging and spectroscopic nuclear magnetic resonance (NMR) system.

The nuclear magnetic resonance phenomenon occurs in atomic nuclei having an odd number of protons and/or neutrons. Each such nucleus has a net magnetic moment such that when placed in a static homogeneous magnetic field, denoted $B_0$, a greater number of the involved nuclei become aligned with the $B_0$ field to create a net magnetization, denoted M, in the direction of the $B_0$ field. The net magnetization M is the summation of the individual nuclear magnetic moments. Because a nuclear magnetic moment is the result of a nuclear spin, the terms "nuclear moment" and "nuclear spin" are generally used synonymously in the art.

Under the influence of the static homogeneous magnetic field $B_0$, the nuclei precess, or rotate, about the axis of the $B_0$ field and hence the net magnetization M is aligned with the $B_0$ field axis. The rate, or frequency, at which the nuclei precess is dependent upon the strength of the total magnetic field applied to a particular nucleus, and upon the characteristics of the nuclei specie being subjected to the total magnetic field. The angular frequency of precession, $\omega$, is defined as the Larmor frequency, in accordance with the equation: $\omega = \Gamma B_0$, wherein $\Gamma$ is the gyromagnetic ratio (and is constant for each nucleus type) and $B_0$ is the strength of the total applied magnetic field to the particular nucleus. Thus, the frequency at which the nuclei precess is primarily dependent upon the strength of the total magnetic field $B_0$; the Larmor frequency increases with increasing total magnetic field strength.

A precessing nucleus is capable of resonantly absorbing electromagnetic energy. The frequency of the electromagnetic energy needed to induce resonance is the same Larmor frequency as the precession frequency $\omega$. During the application of electromagnetic energy, typically by a pulse of radio-frequency (RF) energy, the net magnetization M precesses further away from the $B_0$ field axis (arbitrarily assumed to be the Z-axis of a Cartesian coordinate system), with the amount of precession dependent upon the energy and duration of the RF pulse. A "90°" RF pulse is defined as that pulse of RF energy causing the magnetization M to nutate through an angle of 90° from the direction of the $B_0$ magnetic field, e.g. to move into the X-Y plane (defined by the X-axis and the Y-axis in the Cartesian coordinate system in which the $B_0$ field is aligned along the Z-axis). Similarly, a "180°" RF pulse is defined as that pulse which causes the magnetization M to reverse direction, i.e. move through an angle of 180°, from its original direction (e.g. from the positive Z-axis to the negative Z-axis direction). Following the excitation of the nuclei with RF energy, the absorbed endrgy is re-radiated as an NMR response signal, as the nuclei return to equilibrium. The re-radiated energy is both emitted as radio waves and transferred to molecules, of the sample being investigated, surrounding each re-radiating nucleus.

NMR response signals originating at different spatial locations within the sample can be distinguished by causing their respective resonant frequencies to differ in some predetermined manner. If one or more magnetic field gradients are applied to the sample, and if each gradient field is of sufficient strength to spread the NMR response signal spectra in a predetermined manner, then each nuclear spin along the direction of at least one of the field gradients experiences magnetic field strength different from the magnetic field strength experienced by other nuclear spins, and therefore resonates at a Larmor frequency different from that of any other nuclear spins, as predicted by the Larmor equation. Spatial position of each nucleus contributing to the total NMR response signal can be determined by Fourier analysis, when coupled with knowledge of the applied magnetic field gradient configuration.

The return of nuclear spins to equilibrium, following RF excitation, is referred to as "relaxation". The relaxation process is characterized by two time constants, $T_1$ and $T_2$, both of which are measures of motion on the molecular level. The spatial distribution of the $T_1$ and $T_2$ constants throughout the sample provides information as to the coupling, or interaction, of the nuclei with their surroundings ($T_1$) or with each other ($T_2$) and both provide useful imaging information.

The time constant $T_1$ is referred to as the "longitudinal", or "spin-lattice", NMR relaxation time, and is a measure of time required for the magnetization M to return to equilibrium; that is, time constant $T_1$ measures the tendency of the nuclear spins to realign themselves with the total field $B_0$, after cessation of RF excitation which has moved the spins away from the $B_0$ field direction. The rate of return to equilibrium is dependent upon how fast the stimulated nuclei can transfer energy to the surrounding sample material, or sample lattice. For proton ($^1$) NMR, the time constant $T_1$ can vary from a few milliseconds in liquids to several minutes or hours in solids. In biological tissue, the typical range of time constant $T_1$ is from about 30 milliseconds to about 3 seconds.

The time constant $T_2$ is referred to as the "transverse", or "spin-spin", relaxation time and is a measure of how long the excited nuclear spins oscillate in phase with one another. Immediately after an RF excitation pulse, the nuclear spins are in phase and precess together; however, each nuclear spin behaves like a magnet which generates a magnetic field that affects other spinning nuclei in its vicinity (generating spin-spin interaction). As each nuclear moment experiences its own slightly different magnetic field, due to the spin of adjacent nuclei, that magnetic moment will precess at a different rate and dephase with respect to the other spins, thereby reducing the observable NMR response signal with a time constant $T_2$. Time constant $T_2$ can vary from a few microseconds in solids to several seconds in liquids, and is always less than or equal to time constant $T_1$. In biological tissue, the typical range of time constant $T_2$ for $^1H$ NMR is from about 5 milliseconds to about 3 seconds.

If the static magnetic field $B_0$ itself has inherent inhomogeneities, as is typically the case with a field generated by a practical magnet, these inherent inhomogenities produce additional dephasing action, which hastens the decay of the NMR signal. This additional dephasing action occurs because nuclear spins in different spatial locations are exposed to slightly different magnetic field values and therefore resonate at slightly different frequencies. This new relaxation time, which includes the effects of magnetic inhomogeneities, is generally designated $T_2^*$ ($T_2$ star), where $T_2^* \leq T_2$.

In addition to the effect of spin time constants upon the magnitude of the RF energy re-radiated from a particular nuclei, the frequency of the RF electromagnetic energy re-radiated from any particular nuclei can also be affected by local chemical shifts. Chemical shifts occur where the NMR frequency of resonant nuclei, of the same type in a given molecule, differ because of the different magnetic environments, which are themselves produced by differences in the chemical environment of each of the multiplicity of nuclei. This chemical environment difference may occur, for example, due to electrons partly screening the nucleus of a particular atom from the magnetic field; the nucleus therefore has a somewhat-reduced resonant frequency due to the somewhat-reduced total magnetic field to which that nucleus is subjected. The degree of shielding caused by electrons depends upon the total environment of the nucleus, and therefore the chemical-shift spectrum of a given molecule is unique and can be utilized for identification. Because the resonant frequency (and therefore the absolute chemical shift) is dependent upon the strength of the total applied field, the chemical-shift specturm is generally expressed as a fractional shift, in parts-per-million (ppm), of the NMR frequency, relative to an arbitrary reference compound. Illustratively, the range of chemical shifts is about 10 ppm for protons ($^1H$) to about 200 ppm for carbon ($^{13}C$); other nuclei of interest, such as phosphorous ($^{31}P$) for example, have intermediate chemical shift ranges, e.g. 30 ppm. In order to perform chemical-shift spectroscopy, in which such small chemical shifts are discernible, the homogeneity of the static $B_0$ magnetic field must be better than the differences in chemical shifts of the spectral peaks to be observed, and is typically required to be much better than one part in $10^6$ (1 ppm).

Thus, nuclear magnetic resonance investigation offers two non-invasive probes for detection and diagnosis of disease states in an organic sample: proton ($^1H$) magnetic resonance imaging, which can provide images of the internal human anatomy with excellent soft-tissue contrast brought about by the relatively large differences in NMR relaxation times; and localized phosphorous ($^{31}P$) and carbon ($^{13}C$) chemical-shift spectroscopic imaging to provide direct access to metabolic processes for the assessment of damaged tissue and its response to therapy. In addition, the feasibility of imaging natural-abundance sodium ($^{23}Na$) and artifically-introduced fluorine ($^{19}F$) has recently been demonstrated and may find clinical applications in the near future. It is well known that the magnetic field requirements for $^1H$ imaging can be met at static field strengths below 0.5 Tesla (T) and that spectroscopy typically requires a magnetic field strength in excess of 1 T, with a much higher degree of homogeneity across the examination region than required for imaging. it is also well known that the signal-to-noise ratio of the NMR signal improves with increasing magnetic field strength, if the rest of the NMR system is optimized. It has been widely speculated, in the literature of the art, that human head and body proton imaging is not feasible above a main field strength of about 0.5 T, owing to the dual problems of RF field penetration into the sample to be investigated and to the difficulty of NMR coil design, at the relatively high NMR frequencies associated with the higher-magnitude static fields. Therefore, by at least implication, a single magnetic resonance system having a single high magnetic field magnitude, in excess of about 0.7 T, for producing proton images and localized chemical-shift spectra from anatomical samples, such as the head, limbs and body of human beings, has been considered experimentally incompatible.

A system enabling the performance of both high-field NMR imaging and chemical-shift spectroscopy for medical applications with the human body, and for the analysis distribution of non-ferromagnetic samples (e.g. for analysis and distribution of hydrocarbon deposits and oil-bearing shale sediments, for general morphological and chemical analysis of heterogeneous non-ferromagnetic samples, and the like) has been developed. Due to the large size of the superconducting magnet in this system, it is at least inconvenient, if not often impossible, to reposition the sample to be investigated, to obtain various different views thereof. With samples of highly complex, three-dimensional shape, such as portions of the human anatomy, the inability to shift viewpoint cannot be tolerated; a means for allowing a change in sample viewpoint is required, and the ability to shift between various imaging modalities, e.g. axial, coronal, sagittal and the like, in a relatively short time and especially without requiring complex activity, is highly desirable.

BRIEF SUMMARY OF THE INVENTION

In accordance with the invention, a novel gradient field switch, for use in a nuclear magnetic resonance system for the production of images and localized chemical-shift spectra from a non-ferromagnetic sample (such as anatomical portions of human beings and the like) from a selected one of a plurality of viewing directions about a common imaging point, comprises: a plurality N of inputs means, each receiving a different one of a like plurality N of signals each defining a magnetic field gradient along one of a like plurality N of axes of a multi-dimensional imaging continuum; a like plurality N of output means, each for providing one of a like plurality N of output signals each for the generation of a linear magnetic gradient field in a main applied static imaging field, relative to the set of coordinate axes at said imaging point in the imaging continuum; means for switching each of the signals received at any one of the input means to a selected one of the output means; and means receiving data from said system for controlling the present configuration of said switching means between said input means and said output means.

In a presently preferred embodiment, the imaging continuum is a three-dimensional imaging volume, and the axes are arranged with mutual orthogonality, i.e. form a Cartesian coordinate system. The controlling means can be commanded to redirect the three magnetic field gradient signals to allow a chosen one of axial, coronal or sagittal views to be taken in either normal or reversed orientation.

Accordingly, it is one object of the present invention to provide a novel gradient field switch for a nuclear magnetic resonance system to enable the production of nuclear magnetic resonance and response signals in a chosen viewing direction about a common viewing point, without requiring movement of the sample being imaged.

This and other objects of the invention will become apparent to those skilled in the art, upon a perusal of the following detailed description, when considered in conjunction with the drawings.

BRIEF SUMMARY OF THE DRAWINGS

FIG. 3a is a table useful in appreciating the operational characteristics of the gradient field switch of FIG. 3; and FIG. 3a' is a perspective view of a model of a human head, defining the axial, coronal and sagittal slice directions, and illustrating the operation of the present invention.

DETAILED DESCRIPTION OF THE INVENTION

Prior to describing the presently preferred embodiment of our gradient field switch, the general NMR system, in which our switch is used, will be described so that the characteristics required of our switch can be better appreciated.

THE NMR SYSTEM

Figure 1:
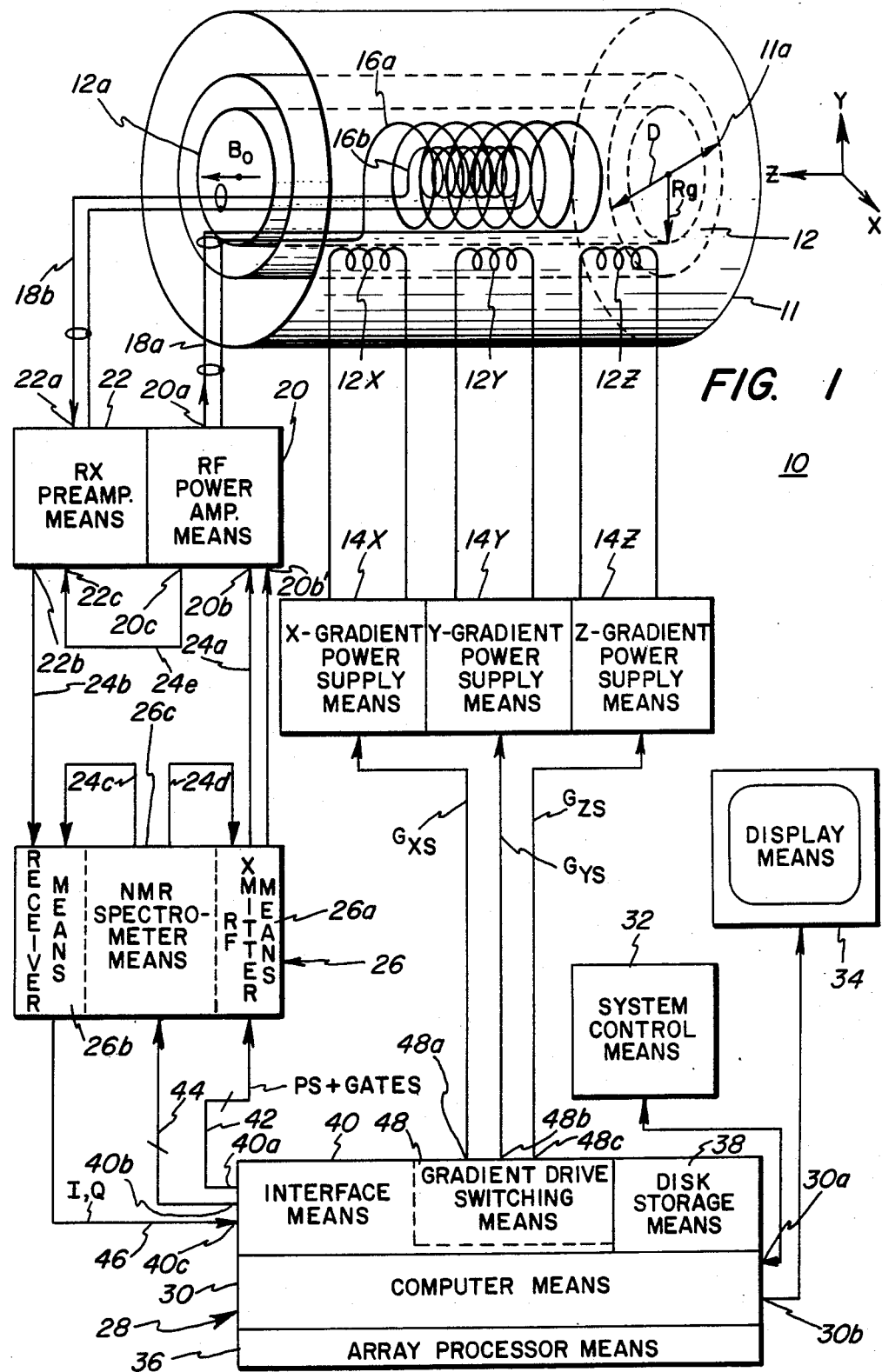
FIG. 1 is a schematic block diagram of a high-field NMR system in which our novel gradient field switch can be used.
Figure 1A:
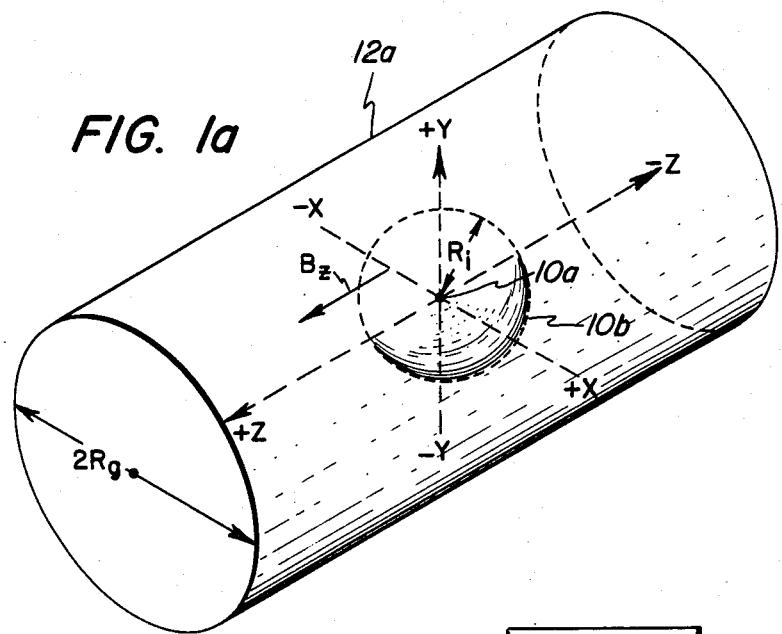
FIG. 1a is a perspective view of the bore of the NMR system magnet means, defining the various imaging coordinates and volumes.

Referring initially to FIGS. 1 and 1a, a magnetic resonance imaging and spectroscopy system 10 utilizes a superconducting magnet means 11 having a room-temperature inner bore 11a of a diameter D, between about 0.4 meters and about 1.5 meters. Magnet means 11 provides a single static magnetic field $B_0$ along the axis of the cylindrical bore 11a; the magnitude of field $B_0$ must be sufficiently high, i.e. not less than about 0.7 Tesla (T), to facilitate production of localized chemical-shift spectra and has an upper limit, i.e. presently about 4 T, established only by available magnet technology for providing a high-field magnet having a useable bore diameter D. By way of example only, magnet means 11 may be a superconducting magnet, available from Oxford Instruments Co. of England, having main magnet coils and a set of a plurality, e.g. 12, of correction coils immersed in liquid helium, with another set of a plurality, e.g. 10, of resistive correction coils. The magnet means has a bore provided by a non-conductive tube, e.g. of fiberglass and the like, which is lined with a thin cylinder of a conductive material, e.g. stainless steel and the like, to provide shielding for the RF magnetic fields. The resulting room-temperature free bore 11a has a diameter D of about 1 meter. An axial static field $B_0$ of high spatial and temporal linearity and stability is provided at a magnitude of about 1.5 T. The static magnetic field $B_0$ is assigned to the Z axis of a three-dimensional Cartesian coordinate system, wherein the X and Y directions are orthogonal to one another and to the Z axis.

Within the magnet means free bore 11a are gradient coil means for generating a set of linear magnetic field gradients in the main static $B_0$ field, relative to the three principal Cartesian coordinate axes. Gradient coil means 12 are typically confined to an annular cylindrically-shaped volume, having a gradient coil means free bore 12a, with a gradient bore radius $R_g$ which is less than the magnet means inner bore radius (i.e. $R_g$ is less than D/2) but is typically not less than about 0.3 meters. Within the annular cylindrical volume, disposed with its axis along the Z axis of the magnet means free bore, are disposed suitable means for providing a magnetic field gradient in each of the three Cartesian coordinate axes; the three gradient field-forming means are schematically illustrated as coil means 12X for forming a magnetic field gradient $G_X(=\partial B_0/\partial x)$ relative to the X coordinate axis, coil means 12Y for forming a magnetic field gradient $G_Y(=\partial B_0/\partial y)$ relative to the Y coordinate axis, and coil means 12Z for forming a magnetic field gradient $G_Z(=\partial B_0/\partial z)$ relative to the axial Z coordinate axis. While coil means 12X, 12Y and 12Z are schematically shown as having common axes, it should be understood that this positioning is for purposes of diagrammatic simplicity only; the actual position and type of gradient field generating means (which may be coils having saddle-shaped, Maxwell pair, or other distributed current winding geometries) is well known to the magnetic resonance imaging art. The only requirement of gradient coil means 12X, 12Y and 12Z is that the means utilized be capable of generating magnetic field gradients in the main applied field $B_0$, which magnetic field gradients may be linear, or otherwise, with respect to the Cartesian coordinate axis associated with each gradient coil means and which magnetic field gradient may be pulsed, or otherwise modulated, as required for the particular magnetic resonance experiment to be conducted.

The magnet means 11 and gradient coil means 12 thus provide a total magnetic field $B_Z$ (FIG. 1a) within the gradient coil means free bore 12a, which total field $B_Z$ is a summation of four separate fields: the static field $B_0$ in the Z axial direction, and gradient fields in the X, Y and Z directions which typically vary linearly with distance along the associated axis. Thus, the total $B_Z$ field is given by:

$$B_Z = B_0 + G_X \cdot x + G_Y \cdot y + G_Z \cdot z,$$

where $G_X = (\partial B_Z/\partial x)$, $G_Y = (\partial B_Z/\partial y)$ and $G_Z = (\partial B_Z/\partial \Delta z)$, and where $G_X$, $G_Y$ and $G_Z$ can be of either polarity. The origin 10a of the Cartesian coordinate system is usually chosen as the center of the region of highest homogeneity of the main static field $B_0$. As shown in FIG. 1a, this point usually corresponds substantially to the midpoint along the length of the bore in each of the three Cartesian directions, although it should be understood that, by variation of the ratio of currents in each of the $G_X$, $G_Y$ or $G_Z$ gradient coil means, the center 10a of a sampling sphere 10b can be moved to any desired location within the imaging cylinder 12a. Typically, the sample sphere will be moved to various locations, especially if the anatomical sample (a human body and the like) cannot, for any reason, be moved in any one of the X, Y or Z directions to place the sample volume of interest at sample sphere center point 10a. The sample sphere 10b has a radius $R_i$ determined by the particular form of magnetic resonance experiment being carried out; typical sample sphere radii are about 5 centimeters for chemical-shift spectroscopy experiments and between about 15 and about 25 centimeters for proton imaging. The linearity of the static $B_0$ field is established by the main and correction windings of the superconducting magnet means 11 and, for a dual imaging/spectroscopy system at a static magnetic field value of about 1.5 T should have a maximum spatial deviation of about 2 parts per million (ppm) across the 5 cm. spectroscopy sample sphere. Typical magnetic field spatial deviations of $\pm 1.7$ ppm across an imaging sphere of radius $R_i$ of 15 centimeters and $\pm 0.05$ PPM across a chemical shift spectroscopy imaging sphere of radius 5 centimeters, have been achieved, as have time stabilities of better than $\pm 1$ PPM/hr for the imaging sphere and better than $\pm 0.1$ PPM/hr for the chemical-shift spectroscopy sample sphere.

The X, Y and Z magnetic field gradients $G_X$, $G_Y$ and $G_Z$ are also subject to spatial and temporal constraints by the imaging/spectroscopy procedures. Two aspects of importance for the gradient fields are: the spatial linearity, which is a function of the gradient coil itself, given a constant coil current flow; and the temporal response of the gradient field to an electrical current impulse which is a function of the time constants of the electronic circuitry supplying the gradient current to the associated gradient coil, the time constants of the gradient coil and the electrical and magnetic characteristics of its environment. The gradient field spatial linearity must be provided solely by the design of the gradient coil itself; many forms of highly volume-linear gradient coils are known, such as, for example, the gradient field coils described and claimed in co-pending application Ser. No. 548,174, filed Nov. 2, 1983, assigned to the assignee of the present application and incorporated herein in its entirety by reference. The gradient field temporal response, while having some relation to the time constants of the gradient coils themselves, is also affected by eddy currents in the surrounding structure, which introduce time-dependent, interfering field perturbations, and only minimally affected by the time constants of the circuitry supplying the gradient-determining current to the associated gradient coil means. For a system utilizing the illustrated Cartesian coordinates, with the gradient field in the direction of each axis being associated with a set of gradient coil means, a separate one of a plurality of gradient power supply means 14 is utilized to establish the gradient current through each associated axis coil means responsive to the instantaneous value of a gradient signal $G_{AS}$, where A is the particular axis direction. Thus, an X-gradient power supply means 14X supplies to the X-axis gradient coil means 12X a $G_X$-gradient-forming current of magnitude and polarity determined by the magnitude and polarity of an input gradient $G_{XS}$ signal; a Y-gradient power supply means 14Y supplies to the Y-axis gradient coil means 12Y a $G_Y$-gradient-forming current of magnitude and polarity determined by the magnitude and polarity of an input gradient $G_{YS}$ signal; and a Z-gradient power supply means 14Z supplies to the Z-axis gradient coil means 12Z a $G_Z$-gradient-forming current of magnitude and polarity determined by the magnitude and polarity of an input gradient $G_{ZS}$ signal. Each of the gradient-forming signals $G_{XS}$, $G_{YS}$ and $G_{ZS}$ is typically of pulsed nature; the amplitude transfer characteristics of each gradient power supply means 14 may be entirely linear or, for use with the gradient switch of this application, may be deliberately established as that predetermined (and possibly non-linear) transfer function required to provide a linear gradient magnetic field in each of the X, Y or Z directions responsive to the actual driving signal provided to the associated power supply means 14. The transfer function of each of the gradient power supply means and its associated gradient coil can thus be made perfectly linear, whereby a perfectly linear gradient magnetic field is provided for a perfectly linear gradient power supply means input signal.

The total magnetic field $B_Z$ acting on each small volume element (voxel) of the sample establishes the exact Larmor frequency of that small volume in conjunction with the gyromagnetic constant $\gamma$ for a particular nuclei species being investigated. That is, a particular species of nuclei, all of which are bound in the same chemical environment, will have identical Larmor frequencies in a uniform magnetic field, but, responsive to the changing magnetic field provided by the field gradients, will have Larmor frequencies occurring over a range, responsive both to the gradient magnitude and polarity and to the position of the volume element containing the radiating nuclei within the total field. The nuclei are initially stimulated by excitation radio-frequency (RF) energy at the Larmor frequency determined by the species gyromagnetic constant and the total field at the sample volume; this RF energy enters the sample from an RF magnetic field provided by an excitation antenna 16a. The RF energy is provided to antenna 16a via an excitation cable 18a, typically of coaxial construction, from the output 20a of an RF power amplifier means 20. Responsive to the excitation RF magnetic field, the various small nuclei voxels each reradiate an RF signal at the Larmor frequency determined by the total instantaneous field magnitude at the species sample location. This reradiated signal is received by a reception antenna 16b and is provided via a cable 18b, also typically of coaxial construction, to the input 22a of a reception RX preamplifier means 22.

RF power amplifier means 20 supplies the excitation signal responsive to a transmitter RF signal provided at the power amplifier means input 20b, via a cable 24a, from the RF output of an RF transmitter means portion 26a, forming part of an NMR spectrometer 26. The signal at a transmitter means portion output is provided at an instantaneous frequency determined by the frequency of a signal provided at a second transmitter means portion input, and with a modulation envelope of shape and timing determined by RF pulse-shape (PS) determining and gating signals provided at a second RF transmitter means portion input.

The response signals received at preamplifier means input 22a are, after low-noise amplification in means 22, provided at an output 22b thereof and coupled, via another cable 24b, to a preamplified signal input of a receiver means portion 26b of NMR spectrometer means 26. The preamplified signal is mixed with a local oscillator frequency to provide a pair of receiver means portion output signals. Power amplifier means 20 provides a gating signal at a third output 20-c, via a cable 24e, to a second input 22c of the preamplifier means 22, for temporarily disabling, and protecting, the preamplifier means whenever an excitation pulse is being provided by power amplifier means 20.

System 10 includes a data processing and control means 28, comprised of a computer means 30, having a first input/output (I/O) port 30a for communications with a systems control means 32 (such as a keyboard device and the like), and an output port 30b for providing video information and the like signals to a display means 34, for providing a temporary display of the information acquired from the anatomical sample being investigated. Data processing and control means 28, in addition to computer means 30, comprises: an array processor means 36 so coupled to computer means 30 as to provide relatively rapid fast Fourier transform (FET) calculations and the like upon data transferred thereto from the computer means; a disk storage means 38 for providing semi-permanent storage and retrieval of relatively large amounts of digital information (e.g. the sample information from each of a multiplicity of sample experiments); and an interface means 40 serving to interconnect the computer means 30 with the NMR spectrometer means 26 and the plurality of gradient power supply means 14.

Interface means 40 has a first output port 40a for providing, via a plurality of signal-carrying conductors 42, the various pulse-shape-determining and pulse gate signals to be transmitted to the control input of transmitter means portion 26a. A second interface means output port 40b provides, via a plurality of conductors 44, the relevant computer data channel signals to the spectrometer input for establishment of spectrometer frequencies and the like common information. An interface means first input port 40c receives, via a plurality of cables 45, the quadrature I and Q signals from the output of receiver means portion 26b.

In accordance with the invention, a gradient drive switching means 48 receives at least one signal and switching data from the interface means to provide the proper gradient drive signals $G_{XS}$, $G_{YS}$ and $G_{ZS}$ at the respective gradient drive signal output ports 48a, 48b and 48c to the respective X-gradient power supply means 14X, Y-gradient power supply 14Y and Z-gradient power supply means 14Z. To properly appreciate the operation of gradient field switch 48, an understanding of some of the functions of interface means 40 is desirable.

THE INTERFACE MEANS

Figure 2:
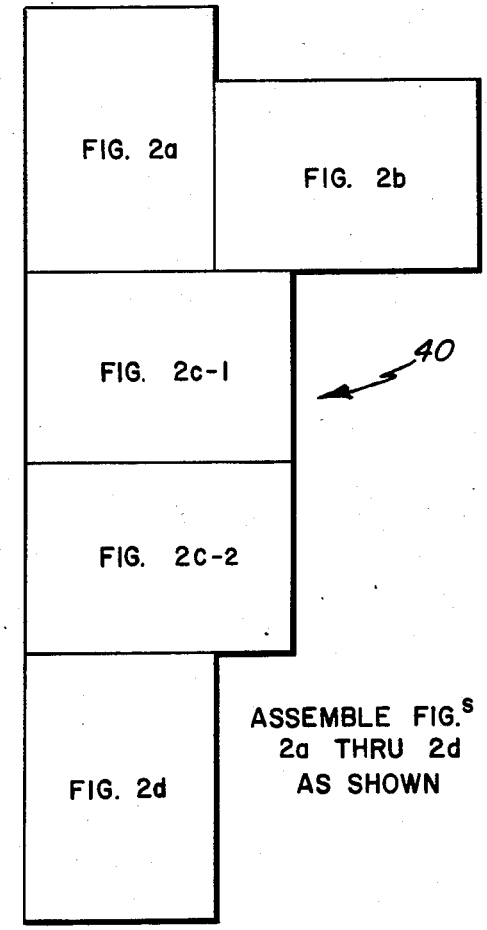
FIG. 2 comprised of the schematic block diagrams of FIGS. 2a–2d, illustrates a presently preferred embodiment for a digital interface means for use with our gradient field switch in an NMR system.
Figure 2A:
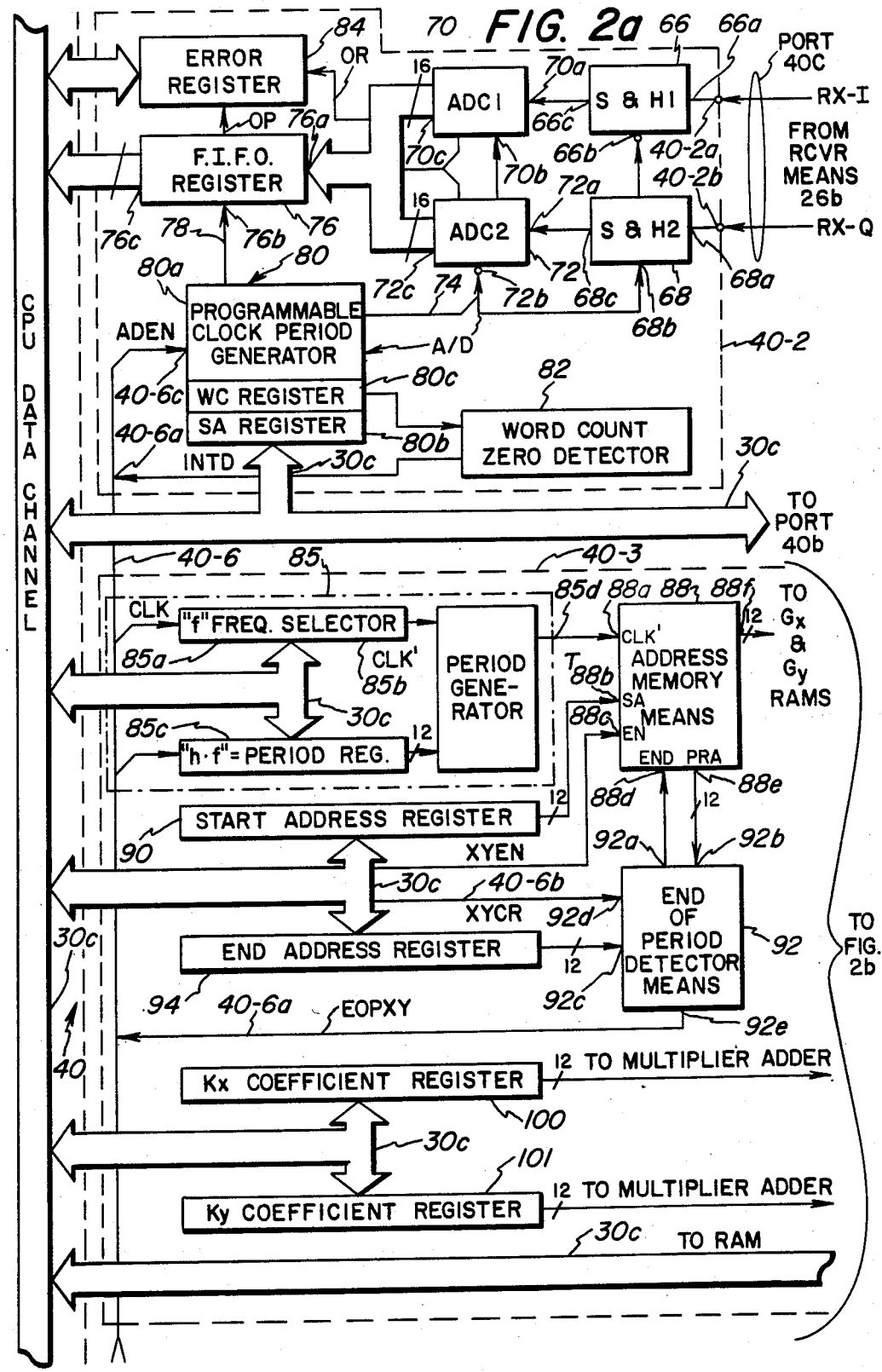
FIG. 2e is a schematic illustration of the 64-bit microcode data word format, a portion of which is transferred via the data bus in the interface means of FIG. 2, and the principles of operation of the interface means.
Figure 2D:
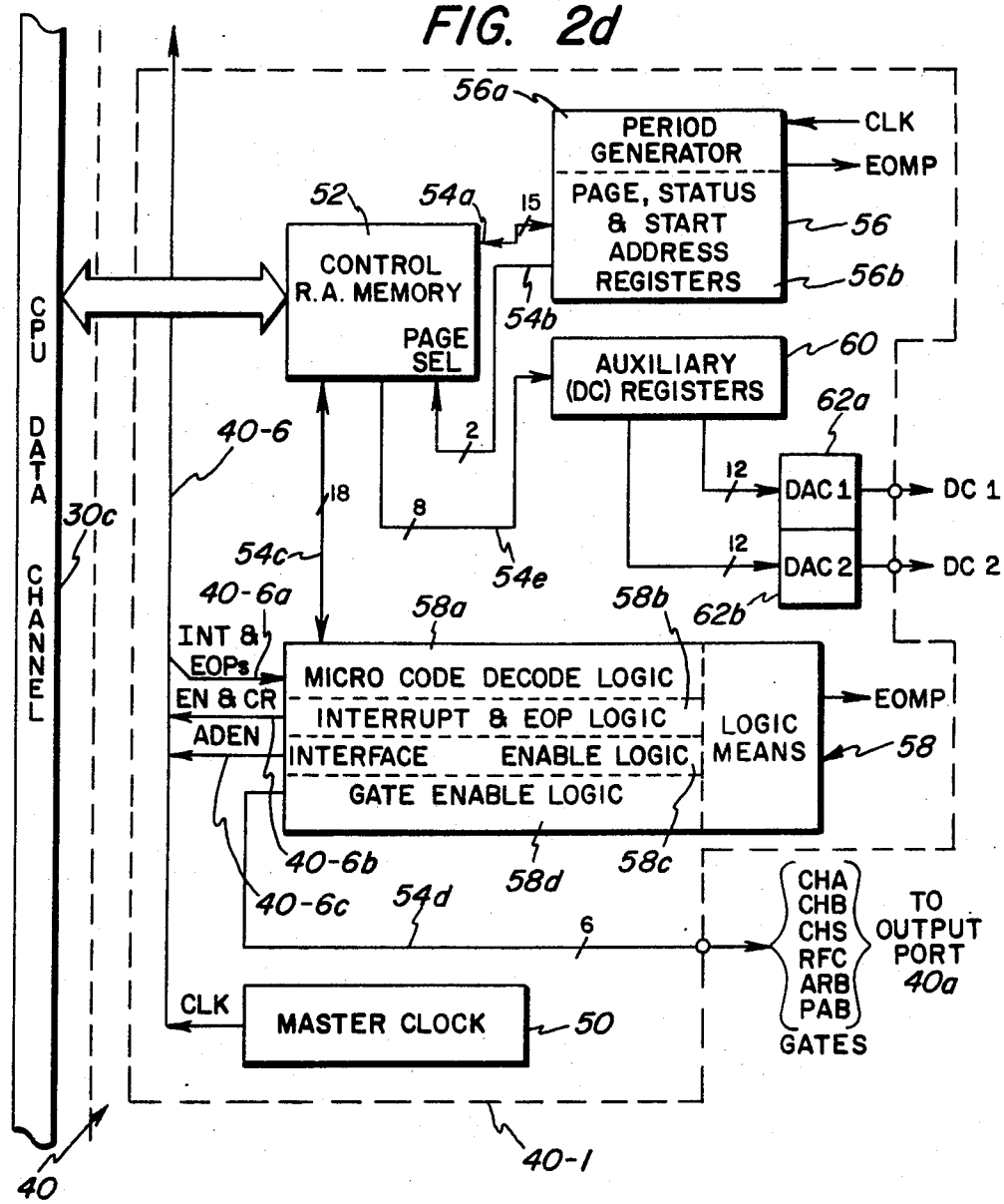
Figure 2E:
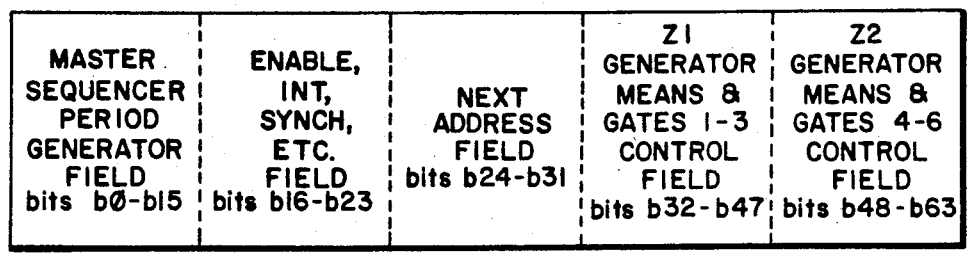

Referring now to FIGS. 2a-2d, joined together as shown by FIG. 2, and to FIG. 2e, interface means 40 receives digital information from the computer means central processor unit (CPU) data channel 30c for providing gradient field signal waveforms $G'_X$, $G'_Y$ and one of a pair of Z-gradient-field signal waveforms $G'_{Z1}$ and $G'_{Z2}$ to means 48; and for providing the pulse-shape, gate and other signal waveforms to, and for receiving other signals from, various parts of system 10. The following illustrative example of interface means 40 is utilized with a general-purpose Data General type S/140 minicomputer (as computer means 30) and with a Floating Point Systems type AB120B high-speed array processor (means 36) in a 1.5 T superconducting magnet imaging/spectroscopy system. Data channel 30c is a 16-bit-wide data bus. Bus 30c provides minicomputer-generated data to: an interface master sequencer portion means 40-1; a digitizer portion means 40-2; an interface first-type waveform-generator portion means 40-3; a pair of interface second-type waveform-generator portion means 40-4 and 40-5; and to the interface means second output port 40b. Interface means 40 also comprises an interface means internal data bus 40-6 having a plurality of conductors interconnecting the master sequencer portion means 40-1 with, and for control of, digitizer portion means 40-2 and waveform-generator portion means 40-3, 40-4 and 40-5. Bus 40-6 is implemented as a 35-bit-wide bus in the illustrated embodiment.

The 64-bit microcode data word has a format, as shown in FIG. 2e, containing five fields. The first 16 bits (i.e. bits b0-b15) form a period generator field which initializes period generator portion 56a to select an output signal waveform of period and/or frequency to be generated during a time interval commencing with the availability of that data word (i.e. when the control memory 52 receives the address of that data word from an register portion 56b) and terminating at the end of the time interval selected by the period generator field for that particular data word. The 16-bit period generator field, coupled with an interval six-decade divider (discussed in further detail hereinbelow) allows each control memory word to be present during any interval from 0.1 microseconds to at least 409.6 seconds. The enable (EN), interrupt (INT) and synchronization (sync.) field is an 8-bit field (i.e. bits b16–b23) which is further subdivided into 8 single-bit subfields to provide the enable, continuous-run, end-of-period interrupt, accept external synchronization and next control memory word address conditions for a present control data word instruction. Separate data bit subfields are provided to, inter alia, initially enable and/or set for continuous run the XY-gradient generator portion means 40-3; enable the digitizer portion means 40-2; issue an interrupt at any end-of-period (EOP) signal from any of the other interface means portion means 40-2 through 40-5; cause all portion means 40-1 through 40-5 to cease operation upon generation of an EOP signal; cause the master sequencer means control memory address to advance to a selected one of the next address or an aternate control memory address, upon generation of an EOP signal; and similar functions. In conjunction with the period generator field, the next 8-bit field (i.e. bits b24–b31) contains the next master sequencer control memory address, which will be called unless a jump to an alternate control memory address is specified in the jump subfield. Since each next-address field is of only 8-bit width, the next address specified must be upon the same 256-word page as the previous address, unless the page register in portion 56b is updated by the CPU, during the period when a present data word is being executed. The data word format ends with a pair of 16-bit fields for respectively controlling the Z1 or Z2 gradient generators and different respective trios of the six gate signals to be made available at interface means output port 40a. Each of the last two fields also provides a 4-bit subfield, which is transmitted via bus 54e to the auxiliary (DC) registers means 60, for selecting the appropriate one of a plurality (e.g. 12) of the auxiliary registers to provide the 12-bit data input to one of DAC means 62a or 62b. The data-correction DC output(s) thus provided can be any auxiliary analog signal(s).

Briefly, master sequencer portion means 40-1 is responsible for performing the following functions:

(1) generating a clock CLK signal (e.g. at 10 MHz.) for synchronization of all interface portion means 40-1 through 40-5;

(2) determining the basic timing relationships between the gradient, gating and other signal waveforms generated by the various interface portion means 40-1 through 40-5;

(3) enabling and disabling other interface portion means 40-2 through 40-5 at specified times;

(4) clocking out "dead" time intervals when none of the other interface portion means 40-2 through 40-5 are enabled;

(5) generating interrupts to the computer means CPU at specified times;

(6) controlling the logic levels of six logic (TTL) gate signals which are used for various system utility functions, such as spectrometer means 26 control, RF excitation signal gating, receiver blanking and the like;

(7) determining whether the system is in a "run" mode wherein waveforms and control signals are being actively generated, or whether the system is in a "dormant" mode wherein those signals are not being generated and interface means 40 is dormant and awaiting instructions from computer means 30, via CPU data channel 30c; and (8) selecting two of a multiplicity of auxiliary DC registers 60 to be gated into the pair of 12-bit DAC means 62 for providing analog signal outputs for use in those parts of the system, such as DC magnet compensation and the like, where response speed is not a critical factor.

In normal operation, the control memory and the page/address registers are downloaded with program information via the CPU data channel 30c. Each control program must fit within one of the four 256-word pages, so that four distinct NMR experiment programs can simultaneously reside in the control memory. Upon receipt of a start signal, master sequencer means 40-1 commences operation and the page and starting address information in register portion 56b is used to select the control memory address to provide a first instruction to logic means 58. Once master sequencer means 40-1 is running, computer means 30 can obtain the status thereof from the status registers in portion 56b. Master sequencer means 40-1 enables, responsive to the signals in the various fields of the data word then provided to logic means 58, the various ones of the output signals to be generated from portion means 40-1 through 40-5 and determines the timing of the various signals generated responsive to the present data word. Master sequencer portion means 40-1 will remain at a particular control memory address, and a particular data word will be acted upon, until the interrupt and EOP logic portion 58b receives either an end-of-master-period (EOMP) overflow signal from the period generator portion 56a of master sequencer means 40-1 or an EOP signal from one of the gradient waveform-portion means 40-3 through 40-5. At the occurrence of either event signaling the end of a predetermined time interval, the control memory jumps to a new memory address.

While further details of the operation of portion means 40-1 (and means 40-2) may be obtained from the aforementioned related application Ser. No. 743,119, for purposes of understanding the signals applied to gradient field switch 48, it should be noted that establishment of timing intervals by proper setting of the period generator field can be utilized to synchronize the activities of a plurality of the waveform-generator portion means 40-3 through 40-5. For example, if one, or both, of the X-gradient field and/or Y-gradient field signal waveforms must commence after exactly one-half of the Z-gradient field signal waveform generated by one of the Z1 or Z2 waveform-generator means 40-4 or 40-5, the master sequencer portion means 40-1 may be programmed to commence the Z-gradient field signal waveform generation at a first address (A), responsive to a data word having a period generator field establishing the period generator portion 56a in a manner such that the EOMP signal is generated at the end of a time interval equal to one-half of the time interval required to generate the entire Z-gradient signal waveform. When this time interval elapses and the EOMP signal is generated, the master sequencer portion means increments the control memory means 52 to its next address. At this next-subsequent address (B), the 64-bit data word contained in control memory 52 contains EN, INT and sync. field subfield bits which enable both the XY waveform-generator portion means 40-3 and the Z1 waveform-generator portion means 40-4. Thus, the XY waveform-generator portion means will begin to generate the required X-gradient field and/or Y-gradient field signal waveforms, while the Z1 waveform-generator portion means will continue operating as if the transition to this next-subsequent data word had not occurred. If the period generator field for this next-subsequent data word (at address B) is set for the same time interval (i.e. one-half the total time interval required) as in the previous data word (at address A), then the X and/or Y and Z gradient fields all terminate at the same time and the X and/or Y gradient fields are present for only one-half the total time interval during which the Z gradient field is present, as initially required. Since all portion means 40-1 through 40-5 are clocked by the common master clock means 50, the synchronization of a plurality of portion means 40-1 through 40-5 is relatively accurate, having a maximum error of only several logic-gate delays (a maximum error time considerably less than the 100-nanosecond clock cycle time for a 10 MHz. CLK signal).

Referring now to FIGS. 2a and 2b, a schematic block diagram of the XY waveform-generator portion means 40-3 is shown. This portion means includes a period generator means 85 similar to the period generators in each of portion means 40-1, 40-2, 40-4 and 40-5. The clock period generator means 85 includes a frequency f selector means 85a which receives the clock CLK waveform from interface means internal bus 40-6 and receives configuring information from the computer means CPU data channel 30c. Frequency selector means 85a generates a periodic divided frequency clock CLK' signal to a first input of a period generator circuit 85b. A second input of period generator circuit 85b receives a 12-bit digital data word establishing the time interval $\tau$ between successive period pulses provided at the pulse generator means output 85d. The 12-bit pulse time interval data word is provided at the output of a period "n·f" register 85c, receiving a 12-bit period-establishing data word from computer means CPU data channel 30c and also receiving a "load" pulse from interface means internal data bus 40-6. The 12-bit data word in period register 85c allows one of 4096 possible values to be chosen for each setting of frequency selector 85a. The frequency selector 85a is provided with three selection data bits, providing eight possible configurations for the CLK' output; the frequency selector is a six-decade frequency divider having a seventh "undivided" selectable output and an eighth "off" selectable output. Thus, the programmable range of period time interval spacings is as shown in the following table:

| PROGRAMMABLE PERIOD GENERATOR OUTPUT PULSE TIMING RANGES | | | |
|---|---|---|---|
| fDATA | DECADE | CLK' FREQ. f | n · f RANGE |
| 000 | 0 | OFF | — |
| 001 | 1 | 10 Hz. | 0.1–409.6 Sec. |
| 010 | 2 | 100 Hz. | 0.01–40.96 Sec. |
| 011 | 3 | 1 KHz. | 1.0 mSec.–4.096 Sec. |
| 100 | 4 | 10 KHz. | 100 μSec.–409.6 mSec. |
| 101 | 5 | 100 KHz. | 10 μSec.–40.96 mSec. |
| 110 | 6 | 1 MHz. | 1 μSec.–4.096 mSec. |
| 111 | 7 | 10 MHz. | 0.1 μSec.–409.6 μSec. |

It will be understood that period generator means 85 can be realized with other forms of circuitry, and that whichever form of period generator means 85 is utilized can be equally as well utilized for the basic period generator portion 56a of means 56 (in the master sequencer portion means 40-1), as the basis for programmable clock period generator portion 80a of means 80 in the digitizer portion means 40-2, and in any other period generator utilization required in our system.

The periodic pulses at period generator means output 85d appear at a clock CLK' input 88a of an address memory means 88. Address memory means 88 includes a first, "start" address (SA) input 88b receiving a starting-address data word from a start address register 90, itself receiving the starting address data from computer means CPU data channel 30c; a second, enable EN input 88c of the address memory means receives an XY-enable (XYEN) signal on portion 40-6b of the internal data bus. Address memory means 88 also has a third, "end" input 88d receiving an end-count signal from a first output 92a of an end-of-period detector means 92. A first input 92b of the end-of-period detector means receives a 12-bit present-address (PRA) data word from a first output 88e of address memory means 88. The 12-bit data word corresponding to the present address appears at the data output 88f of address memory means 88. End-of-period detector means 92 also receives an end-address data word at another input 92c, from an end address register means 94, itself receiving the 12-bit end address data from computer means CPU data channel 30c. A third input 92d of the end-of-period detector means receives a continuous-run XYCR signal, via the internal data bus line 40-6b, from logic means interface enable logic portion 58c and provides a second output 92e on which an XY waveform-generator portion means end-of-period (EOPXY) signal is provided to the internal data bus interrupt portion 40-6a for return to the master sequencer logic means interrupt & EOP logic portion 58b.

The 12-bit address word at memory means output 88f is provided to the address inputs 96a and 97a, respectively, of an X-gradient Gx random access memory (RAM) means 96 and a Y-gradient Gy RAM memory means 97, respectively. Data can be loaded into RAM memory means 96 and 97 via the CPU data channel 30c connection to the RAM means data and control inputs ports 96b and 97b, respectively. Output data appears at a portion 96b' or 97b' of the respective RAM means data ports 96b or 97b, respectively. The 12-bit output data words appearing at these ports are respectively provided to the Gx inputs 98a or the Gy inputs 98b of a multipler-adder means 98. Means 98 also has a pair of inputs 98c and 98d for respectively providing multiplier coefficient Kx and Ky data, respectively, from a Kx coefficient register means 100 or a Ky coefficient register means 101. The coefficient data is provided directly to the appropriate one of register means 100 or 101 from computer means CPU data channel 30c. Means 98 first (or "X") output 98e provides a 12-bit data word, corresponding to the product of the X-gradient Gx term and the X-gradient coefficient Kx term, to the input of an X-gradient Gx digital-to-analog converter DAC means 102, while a second (or "Y") output 98f provides a 12-bit data word, which is the product of the Y-gradient Gy data and the Y-gradient coefficient Ky data, to the input of a Y-gradient Gy DAC means 103. The respective X-gradient G'x signal and Y-gradient G'y signal are provided at the first waveform-generator portion means outputs 40-3a and 40-3b, respectively, as audio-frequency analog signals having a maximum ±10-volt amplitude; these signals are coupled to gradient drive switching means 48.

In operation, the XY waveform-generator portion means 40-3 has two basic operating modes: the "load" mode and the "run" mode. In the "load" mode, gradient waveforms are not being generated and all of the computer means-accessible registers and memories (e.g. registers and/or memories 85a, 85c, 90, 94, 96, 97, 100 and/or 101) can have data read therefrom or written thereto by the computer means central processing unit, via data channel 30c. The "load" mode corresponds to the "XY enable" signal XYEN being in a logic 0 condition. When XYEN is in a logic 1 condition, the XY waveform-generator portion means 40-3 is in the "run" mode. Assuming that the appropriate frequency f, period n·f, start address SA and end address EA information has been previously loaded into respective frequency selector register means 85a, period register means 85c, start address SA register means 90 and end address register means 94a, that the necessary Gx and Gy data has been loaded into memory means 96 and 97, respectively, and the required Kx and Ky coefficient information has been entered into registers 100 and 101, then the appearance of a logic 1 XYEN signal causes the following operations to occur: the start address SA data is loaded into address memory means 88; the end address data is loaded into end-of-period detector means 92; and period generator means 85 begins to produce CLK' pulses each occurring τ seconds apart. Each of the start and end addresses represents one of the 2048 possible addresses in address memory means 88. Responsive to the XYEN signal, the first, starting address SA is provided at memory means output 88f, to the RAM means 96 and 97. The data previously stored therein at the first address is made available to the Gx and Gy inputs 98a and 98b, respectively, of means 98, and is individually multiplied by the appropriate Kx or Ky coefficient from the associated one of registers 100 or 101. The resulting gradient data is transformed into an analog level by the associated one of DAC means 102 or 103 and appears at the associated one of outputs 40-3a or 40-3b. Responsive to the first pulse from period generator means output 85d, the address of memory means 88 is advanced to the next address stored therein. This new present address PRA data word is checked by the end-of-period detector means 92 against the end address data word stored in register means 94. If the present address of address memory means 88 does not match the end address of register 94, the end-of-period detector means 92 does not send an "end" signal to memory means input 88d. The new address data is provided to memory means 96 and 97 and the associated waveform data at the second requested address in each RAM means is sent to the multiplier means 98, with the new scaled waveform data being converted into the associated analog levels for appearance at the portion means outputs. The address memory means continues to provide new addresses, sweeping out the range from the start address, contained in register 90, to the end address, contained in register 94, to determine the X and Y gradient output signal waveforms. If the stop address is numerically less than the start address, the address memory means will increment from the start address until the highest address in memory means 88 is reached and will then "wrap around" to address zero and continue to increment the address memory means address data until the "end address" is reached. This "wrapping around" facility does not affect any end-of-period condition for the XY portion means 40-3. The actual end-of-period EOPXY signal will be sent from means 92 only when the present-address PRA data received from address memory means output 88e is equal to the end address data received at input 92c from register means 94. The time that is required to traverse the range of addresses from the start address to the end address is the product of the address range to be stepped through and the time interval $\tau$ between successive-address-enabling pulses from period generator means output 85d. Unless the continuous run XYCR signal is at a high logic level, each time the address memory means has advanced to the end address the end-of-period detector means 92 sends the EOPXY signal to the master sequencer portion means 40-1, and address memory means 88 is reloaded, by the appearance of an "end" signal at input 88d (from end-of-period detector means output 92a) to the start address presently contained in register means 90. Thereafter, the master sequencer portion means control memory 52 determines subsequent activity of the XY waveform-generator portion means 40-3. That is, the master sequencer control memory reacts to the EOPXY signal (or, alternatively, to any other EOP signal) by incrementing to its next control memory address. At this next control memory address, the contents of the 64-bit control memory data word will determine, for example, whether the XY waveform-generator portion means is again to receive an XYEN enabling signal to cause this portion means to once more begin to sweep out the memory addresses (and therefore the gradient signal waveforms) presently contained therein. If the XY waveform-generator portion means is not enabled, all activity in portion means 40-3 ceases until the master sequencer portion means once again sends the enabling XYEN signal.

If, however, the present master sequencer control word is such that an XY waveform-generator portion means continuous-run (XYCR) signal is present at detector means input 92d, then the end-of-period detector means 92 is inhibited from sending the EOPXY end-of-period signal when the ending address is present in address memory means 88. However, the auto-reload of the start address SA data from register means 90 into address memory means input 88b will still occur and therefore the XY waveform-generator portion means will continuously sweep out the address range from the previously-loaded "start address" to the previously-loaded "end address", until the XYEN enabling signal falls to a low logic level for any reason.

While the address memory means output 88f data word sweeps from the starting address to the ending address, as controlled by enabling continuous-run signal, the associated addresses in the $G_x$ and $G_y$ RAM means 96 and 97 are cyclically swept out. This provides a changing sequence of 12-bit data words to the $G_x$ and $G_y$ inputs of multiplier means 98. Each of the $G_x$ and $G_y$ actual data words are multiplied by the appropriate $K_x$ or $K_y$, respectively, coefficients from register means 100 or 101 to provide the digital data inputs for the X and Y gradient DAC means 102 and 103 and provide, responsive thereto, the analog audio-frequency gradient signals at outputs 40-3a and 40-3b.

Referring now to FIGS. 2c-1 and 2c-2, a pair of second-type waveform-generator portion means 40-4 and 40-5 are seen to contain essentially all of the same means as contained in the first-type waveform-generator portion means 40-3. As with portion means 40-3, portion means 40-4 and 40-5 each generate a pair of audio-frequency analog signal waveforms. Two different Z-gradient waveforms are often required for a single NMR imaging or spectroscopy sequence, as are two different RF pulse-shape modulation functions. As will be seen in subsequent discussion, hereinbelow, of some of the presently preferred imaging/spectroscopy sequences, the X-gradient and Y-gradient signals generally require only a single signal, of the same waveshape, amplitude and time duration, in each repetition of a particular imaging sequence, whereby any X-gradient or Y-gradient signal waveform changes can be commanded from the computer means CPU data channel 30c, in a relatively short time after the EOP of a first sequence and immediately prior to the start of a second sequence. Conversely, the Z-gradient waveform typically requires two different amplitude/time duration waveforms (even if of the same waveshape during any one particular sequence) while the RF pulse-shaping modulation (PS) gate function is often required to generate a pair of waveforms having entirely different durations, waveforms and/or amplitudes, as, for example, in any single sequence requiring a selective 90° RF pulse, typically provided with a frequency-limiting modulation envelope (such as a Gaussian, sinc or other non-rectangular waveform) and also requiring a non-selective 180° RF pulse, having a rectangular PS modulation envelope and an entirely different amplitude and duration than the selective 90° non-rectangular RF pulse. For these reasons, two Z-gradient signal waveforms $G'_{Z1}$ and $G'_{Z2}$ are to be generated, in addition to first and second RF carrier pulse-shaping PS1 and PS2 modulation envelopes. It is somewhat arbitrary as to which of the two second-type waveform-generator portion means 40-4 and 40-5 generate which pair of the four signals; however, since only one pulse-shaping PS waveform signal is generally required at the same time as a Z-gradient signal waveform, it is advantageous to have one of the portion means, e.g. portion means 40-4, generate a first Z-gradient waveform and a first pulse-shaping signal waveform, while the other portion means, e.g. portion means 40-5, also generates a single Z-gradient signal waveform and a single pulse-shaping PS signal waveform. Since the Z-gradient and pulse-shaping waveforms are often enabled and disabled in sets, the above partitioning allows one of portion means 40-4 or 40-5 to be enabled at any one time, while the other portion means 40-5 or 40-4 is simultaneously disabled and being downloaded with new data from data channel 30c, for subsequent enablement at a future time (when the other one of the portion means is disabled and being newly down-loaded with data for a next subsequent usage). In this manner, the varying Z-gradient and/or pulse-shaping functions can be rapidly modified during any particular NMR investigation sequence.

Each of portion means 40-4 and 40-5 has the period generator, address memory, start address register, EOP detect, end register, RAM, constant registers, multiplier-adder and analog-to-digital conversion means shown, and numbered with reference designations similar to those of portion means 40-3 (where means 40-4 has single-prime reference designations in FIG. 2c-1 and portion means 40-5 has double-prime reference designations in FIG. 2c-2). The sequence of operation, responsive to the CLK signal to generate individually programmable memory-updating time interval signals $\tau_1$ or $\tau_2$, and with enable responsive respectively to one of a first Z enable (Z1EN) or a second Z enable (Z2EN) signal, with continuous-run capability responsive to the appropriate one of a first Z continuous-run (Z1CR) or a second Z continuous-run Z2CR signal, and generation of end-of-period signals EOPZ1 or EOPZ2, respectively, will be understood by referring to the discussion of operation of portion means 40-3 hereinabove. The respective first and second gradient "axis" signals $G'_{Z1}$ or $G'_{Z2}$, or the first and second pulse-shaping signals PS1 or PS2 can be switched responsive to computer means CPU signals and/or switching signals provided on the interface means internal data bus 40-6 from master sequencer portion 40-1. Only one axis-gradient $G'_Z$ signal and only one pulse-shaping PS gate signal are provided by the pair of portion means 40-4 and 40-5 at any particular instant.

THE GRADIENT DRIVE SWITCH

Figure 3:
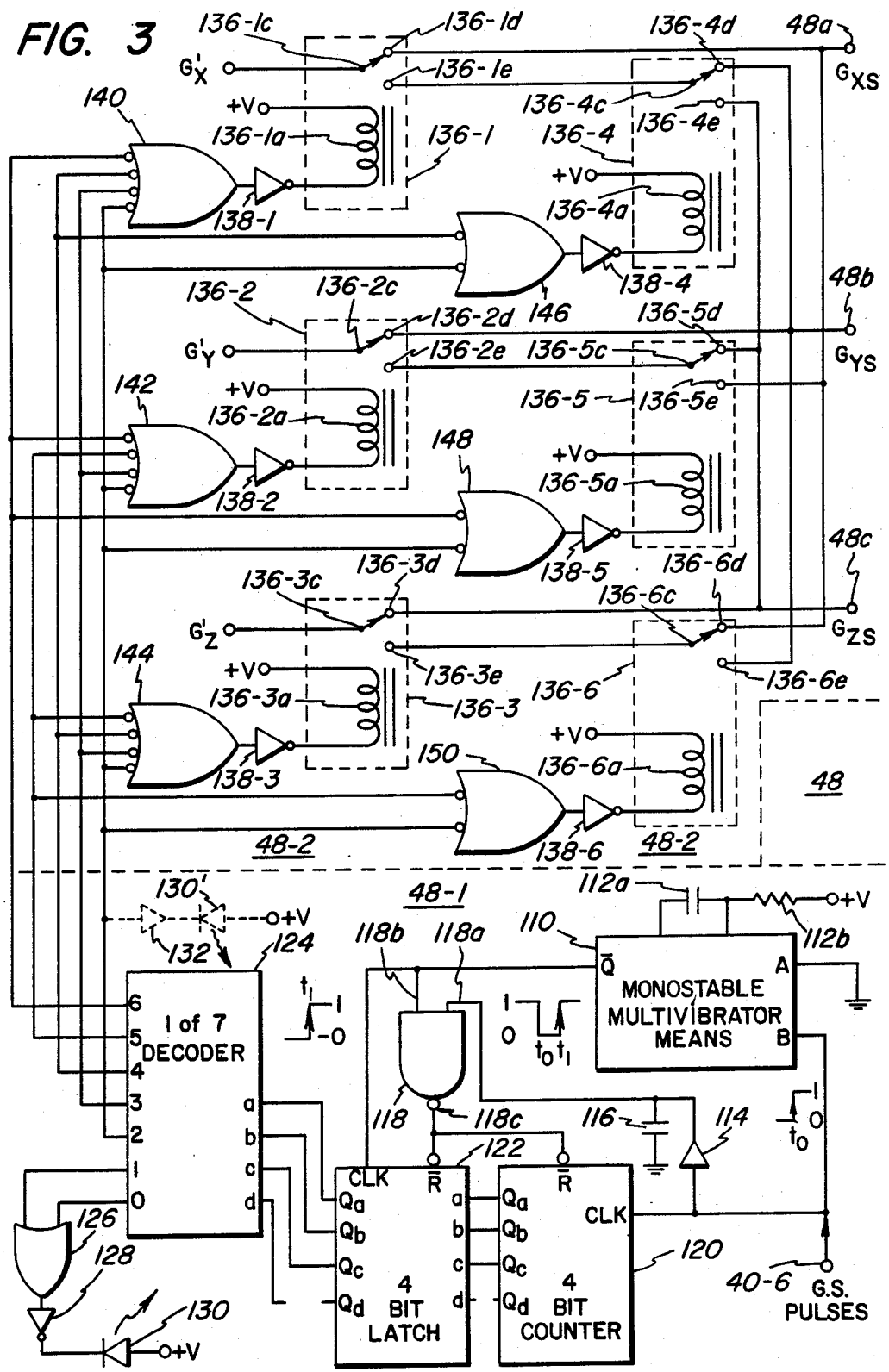
FIG. 3 is a schematic diagram of a presently preferred embodiment of the novel gradient field switch of the present invention.

Referring now to FIGS. 3, 3a and 3a', in accordance with the principles of the present invention, gradient drive switching means 48 receives the three axis gradient-field signals $G'_X$, $G'_Y$ and $G'_Z$ from interface means portion means 40-3 and one of portion means 40-4 or 40-5. The gradient drive switch then routes each of these three signals, responsive to prior-received gradient switching commands, to become the commanded one of: output signal $G_{XS}$ supplied to the input of the X-gradient power supply means 14x; output signal $G_{YS}$ supplied to the input of the Y-gradient power supply means 14y; and output signal $G_{ZS}$ supplied to the input of the Z-gradient power supply means 14z.

Gradient drive switch 48 comprises a control portion 48-1 and a switching portion 48-2. Control portion 48-1 receives gradient switching (GS) pulses from any one of the plurality of control gates 40a, which pulses are provided responsive to at least a portion of the 64-bit control data word stored in master sequencer portion means 40-1. Control portion 48-1 provides control signals to switching portion 48-2, to control switching of the appropriate one of input signals $G'_X$, $G'_Y$ and $G'_Z$ to the appropriate one of outputs 48a–48c. Control portion 48-1 includes a monostable multivibrator means 110 (such as a standard TTL 74LS122 and the like) having a negative-going trigger A input connected to ground potential and a positive-going trigger B input receiving the gradient selection GS pulses; responsive to each positive-going logic transition, occurring at any time $t_0$, at the B input of means 110, the normally-high logic level $\bar{Q}$ output provides a low logic level pulse of duration $(t_1-t_0)$, e.g. about 100 milliseconds, as established by the associated timing capacitive element 112a and timing resistance elements 112b. The input gradient switching pulses are also applied to the input of a non-inverting buffer means 114, having its output connected to one terminal of a delay capacitive element 116 and to a first input 118a of a two-input NAND gate 118. The remaining input 118b of the gate is connected to the $\bar{Q}$ output of multivibrator means 110.

The gate output 118c is connected to the reset $\bar{R}$ input of a 4-bit counter means 120, having its clock CLK input connected to the input of buffer means 114 and thus receiving the gradient selection GS pulses, and also to the reset R input of a 4-bit latch means 112, having its clock CLK input connected to the Q output of multivibrator means 110. The first three stage outputs $Q_a$, $Q_b$ and $Q_c$ of counter means 120 are connected to the first three bit-stage inputs a, b and c, respectively, of latch means 122. The first three latch stage outputs $Q_a$, $Q_b$ and $Q_c$ of latch means 122 are connected to the first three stage inputs a, b and c of a one-of-seven decoder means 124. The "logic 0=true" outputs of decoder means 124 are configured such that the 0 and 1 outputs are respectively connected to different inputs of a two-input OR gate 126, having its output connected through an inverting buffer 128 to the cathode of a light-emitting diode (LED) 130. The anode of diode 130 is connected to a positive potential source such that LED 130 is lit whenever one of the 0 or 1 outputs of decoder means 124 is true; the 2–6 outputs of the decoder means form the outputs of control portion 48-1 to the switching portion 48-2. Each of these five lines may have the status thereof indicated by connection of the individual line through a buffer amplifier 132 and an associated LED 130' (both shown in broken line), if total interface gradient drive switching means status is to be visually observable.

Switching portion 48-2 comprises a plurality, e.g. six, of switching means 136, e.g switching means 136-1 through 136-6 each illustratively being of the single-pole, double-throw electromechanical relay variety. The first three switching means 136-1 through 136-3 determine if the particular input signal $G'_N$ (where N=X, Y or Z) is to be switched to the $G_{NS}$ output or is to be switched to a different gradient drive switch output; the second plurality of switching means 136-4 through 136-3 determine to which of the other outputs the particular input signal is to be connected if the first switching means determines that the $G_{NS}$ output is not to be connected to the $G'_N$ input. Thus, the common terminal 136-1c, 136-2c or 136-3c, respectively, of the first three switching means 136-1 through 136-3, are respectively connected to receive the respective $G'_X$, $G'_Y$ or $G'_Z$ signal respectively. Each of the respective normally-closed, first selectable output terminal 136-1d, 136-2d or 136-3d is respectively connected to the associated one of the $G_{XS}$ output terminal 48a, the $G_{YS}$ output terminal 48b or the $G_{ZS}$ output terminal 48c. The normally-open, second selectable terminal 136-1e, 136-2e or 136-3e are each directly connected to the common terminal 136-4c, 136-5c or 136-6c of the associated one of the second plurality of switching means 136. Each of this second plurality of switching means is configured to select one of the other two output terminals. Thus, that one of the second plurality of switching means 136-4 through 136-6 associated with a particular input can select the next two outputs of the XYZ triad. That is, switching means 136-4, associated with the X channel, can be switched between a normally-closed first selectable terminal 136-4d connected to the Y-gradient $G_{YS}$ output 48b, or to the normally-open second selectable terminal 136-4e connected to the Z-gradient $G_{ZS}$ output 48c; the second switching means 136-5 can be switched between the normally-closed first selectable terminal 136-5d connected to the Z-gradient $G_{ZS}$ output 48c, or to the normally-open second selectable terminal 136-5e connected to the X-gradient $G_{XS}$ output 48a; and switching means 136-6 can be configured to connect between the normally-closed first selectable terminal 136-6d connected to the X-gradient $G_{XS}$ output 148a, or the normally-open second selectable terminal 136-6e connected to the Y-gradient $G_{YS}$ output 48b. For the illustrated electromechanical relay form of switching means 136, each switching means actuating coil 136-1a through 136-6a is connected between a source of operating potential +V, and the output of an associated inverting buffer means 138-1 through 138-6. Each of the first plurality of inverter buffer means 138-1 through 138-3 is driven by the output of an associated one of a four-input NOR gate 140, 142 or 144. The inputs of gate 140 are respectively individually connected to the associated one of the 2, 3, 4 or 6 output of control portion decoder means 124, while the outputs of gate 142 are respectively individually connected to the associated one of the 2, 3, 5 or 6 output of decoder means 124, and the inputs of gate 144 are respectively individually connected to the associated one of the 2, 3, 4 or 5 output of decoder means 124. A second plurality of two-input NOR gates 146, 148 and 150 have their outputs connected to the input of the associated one of inverting buffer means 138-4 through 138-6, with each two-input gate having one of its inputs connected to the two-output of decoder means 124 and having the other input respectively individually connected to the associated one of the 4, 6 or 5 output of the decoder means.

In operation, gradient drive switch 48 operates responsive to gradient-switching GS pulses of two types: a "long" gradient pulse, having a time duration greater than the duration of the pulse at the $\overline{Q}$ output of multivibrator means 110; or a "short" gradient pulse, having a time duration less than the duration of the pulse at the multivibrator means output. Each pulse starts at a resting low logic level and is present for the desired time at a high logic level. Responsive to the delay introduced to the incoming pulse by buffer 114 and delay capacitance 116, a long pulse will be present at gate input 118a after the multivibrator 110 output pulse has returned to the logic 1 level, and will not only generate a low logic level resetting pulse to counter means 120 and latch means 122, but will also thereafter generate a positive-going clocking pulse at the latch means clock CLK input. The short pulse is present for an insufficiently-long time to generate a resetting signal at the gate 118c output, although a short pulse will generate a clock edge advancing the count in counter means 120 and will thereafter provide, via the positive-going edge of the multivibrator means output pulse, a CLK signal latching the new count to the output of latch means 122.

At the very end of any NMR experiment sequence or at the very beginning of a next experiment signal sequence, gradient drive switching means 48 can receive a sequence consisting of none or one long pulse and none to six short pulses. The absence of an initial long pulse acts to preclude resetting of control portion 48-1; if no short pulses follow, the output gradient signals are not affected and remain as previously commanded. The use of at least one short pulse without an initial long pulse is "locked-out" in the programming of the computer means and/or the interface means master sequencer portion means. It should be understood, however, that additional logic elements may be added to control portion 48-1, between the counter CLK input and the inputs to buffer 114 and multivibrator 110, or otherwise as easily determined by one skilled in the digital arts and in accordance with the desired "lock-out" characteristics, to prevent a short pulse from having any effect upon gradient drive switching means control portion 148-1 unless preceded by a long pulse. In the illustrated presently preferred embodiment, any gradient switching GS pulse sequence beginning with at least one long pulse can be followed by 1-6 short pulses. The use of a long pulse followed by zero short pulses or a long pulse followed by more than six short pulses, is specifically "locked-out" in the system programming, although, as before, it should be understood that additional digital circuitry may be utilized in control portion 48-1, to provide a hardware alternative for this software "lock-out".

Valid gradient switching sequences are thus initialized with a single long pulse and then have 1-6 short pulses. With a single short pulse in the setting sequence, decoder output 1 is set to a low logic level; as output 1 is not connected to any of gates 140-150, switching means 136 all remain in their normally-closed conditions. Therefore, each of the first plurality of switching means 136-1 through 136-3 respectively connect the X input to the X output, the Y input to the Y output and the Z input to the Z output; this commands a normal axial view, in which a slice of constant thickness in the Z direction through a sample is provided (as shown by the axial slice profile, through the diagrammatic head of a patient being medically investigated by the system, as shown in FIG. 3a').

With a pair of short pulses following a long resetting pulse, the decoder means 2 output is enabled to the low logic level and actuates all six switching means, whereby the X input $G'_X$ signal is connected to the $G_{ZS}$ output 48c, the Y-gradient input signal $G_Y$ is connected to the $G_{XS}$ output 48a and the Z-gradient signal input $G'_Z$ is connected to the $G_{YS}$ output 48b. This has the effect of rotating the gradients to the "right" in the gradient matrix and provides an experiment slice of constant thickness in the X direction, for a normal sagittal view.

The use of a trio of short pulses, following a long resetting pulse, rotates the input-output signals to the "left" in the gradient matrix and provides a slice of constant thickness in the Y direction, providing a normal coronal view. Similarly, and specifically as shown in the table of FIG. 3a, a quartet, pentad or hexad of short pulses following one or more resetting long pulses cause a gradient matrix swapping operation, respectively between the X and Z axes, the Y and Z axes or the X and Y axes, to provide a rotated sagittal view, a rotated coronal view, or a rotated axial view, respectively.

It will now be seen that, if the gradient-field coil means 12 and the associated gradient power supply means 14 are set such that each of the gradient signals $G_{NS}$ (where N=X, Y or Z) thereto causes the gradient to have a constant and predetermined spatial displacement per unit input magnitude factor, e.g. one millimeter of separation between voxels for a one volt difference in gradient-field input signals $G_{NS}$, the gradient signals can be freely switched between the various axes' power supply/coil means and provide a substantially undistorted image for all six image-slice directions. It should be understood that, even if the gradient power supply/coil means is linearized for a linear gradient field per unit input relationship, e.g. a one gauss difference in gradient field for each one volt gradient signal $G_{NS}$ difference, any resulting distortion when switching between slices (having constant thicknesses) in each of the three different axial directions) can be alleviated by the use of different coefficients $K_n$ downloaded into the various registers of interface means portion means 40-3. 40-4 and/or 40-5, to provide a gradient characteristic of constant voxel separation distance per unit of constant input signal difference.

While one presently preferred embodiment of our novel gradient field switch for a magnetic resonance imaging and spectroscopy system has been described in some detail herein, many variations and modifications will now become apparent to those skilled in the art. It is our intent, therefore, to be limited only by the scope of the appending claims and not by way of the specific details and instrumentalities presented by way of description of the presently preferred embodiments herein.

What we claim is:

1. In a nuclear magnetic resonance system for the production of localized chemical-shifted spectra and images from a non-ferromagnetic sample positioned in a system imaging volume containing a main static magnetic field, said system including a plurality N of means each for generating a different magnetic field gradient in the main static magnetic field along only one associated different one of a plurality N of substantially orthogonal axes of said imaging volume, with each magnetic field gradient having characteristics established by one associated one of a like plurality N of gradient-defining signals, the improvement of said system including a gradient field switch comprising:

a plurality N of input means each for receiving a different one of the like plurality N of gradient-defining signals;

a like plurality N of output means each for providing one of a like plurality N of output signals to one associated different one of the magnetic gradient field generating means;

means for switching the gradient-defining signal received at any one of the input means to a selected one of the output means, different from all other ones of the output means to which any other signal from any other one of the input means is switched; and means receiving data from the system for controlling the present configuration of said switching means between said input means and said output means to select a desired one of a plurality of viewing directions, each definable with respect to the axes of the sample-containing volume, without requiring movement of said sample or any physical portion of said system.

2. The improved system of claim 15 wherein said plurality N is 3.

3. The improved system of claim 2, wherein the sample is anatomical and said controlling means is adapted to configure said switching means to allow the desired viewing direction to be that direction required for a chosen one of axial, coronal and sagittal sections.

4. The improved system of claim 3 wherein said controlling means further allows the chosen section to be taken in a chosen one of normal and reversed orientations.

5. The improved system of claim 1, wherein said switching means comprises a plurality N of input switches, each having a common terminal connected to only one different associated one of said plurality N of input means, and each having a plurality of output terminals selectably connectable to said common terminal and with at least one of the output terminals of each input switch being connected to said selected output means.

6. The improved system of claim 5, wherein only one output terminal of each input switch is connectable at any time to the common terminal of that input switch.

7. The improved system of claim 5, wherein said switching means further comprises a plurality of output switches, each having a common terminal connected only one different associated input switch output terminal not connected to one of said plurality N of output means, and each having a plurality of output terminals each connected to a different one of said plurality of output means.

8. The improved system of claim 7, wherein N=3 and the number of input and output switches is each equal to three.

9. The improved system of claim 1, wherein N=3; and said controlling means includes: means for recognizing if said system data contains at least one resetting signal followed by at least one configuration signal; and means for causing the switching means to connect each of the N=3 input means, designated respectively $G'_X$, $G'_Y$ and $G'_Z$, to an associated one of the N=3 output means, designated respectively as $G_{XS}$, $G_{YS}$ and $G_{ZS}$, responsive to the number of configuration signals and in accordance with the control pattern:

| NUMBER OF CONFIGURATION SIGNALS | CONNECT $G'_X$ TO | CONNECT $G'_Y$ TO | CONNECT $G'_Z$ TO |
| --- | --- | --- | --- |
| 1 | $G_{XS}$ | $G_{YS}$ | $G_{ZS}$ |
| 2 | $G_{ZS}$ | $G_{XS}$ | $G_{YS}$ |
| 3 | $G_{YS}$ | $G_{ZS}$ | $G_{XS}$ |
| 4 | $G_{ZS}$ | $G_{YS}$ | $G_{XS}$ |
| 5 | $G_{XS}$ | $G_{ZS}$ | $G_{YS}$ |
| 6 | $G_{YS}$ | $G_{XS}$ | $G_{ZS}$ |

10. The improved system of claim 9, wherein said recognizing means includes means for counting the number of configuration signals received after reception of any resetting signal and prior to a next subsequently received resetting signal.

11. The improved system of claim 10, wherein said counting means comprises a counter having a clock input receiving at least said configuration signals each as a signal pulse, a reset input, and a plurality of outputs at which binary signals appear responsive to the number of signal pulses received at said clock input after the last activation of said reset input.

12. The improved system of claim 11, wherein said recognizing means further includes: means for temporarily storing the count in said counter, responsive to another clock signal occurring after the last activation of said counter reset input.

13. The improved system of claim 11, wherein said recognizing means further includes means for generating a pulse signal to the reset input of at least said counter, responsive to each resetting signal.

* * * * *